United States Patent
West

(10) Patent No.: US 7,248,483 B2
(45) Date of Patent: Jul. 24, 2007

(54) HIGH POWER DENSITY INSULATED METAL SUBSTRATE BASED POWER CONVERTER ASSEMBLY WITH VERY LOW BUS IMPEDANCE

(75) Inventor: Richard T. West, Pismo Beach, CA (US)

(73) Assignee: Xantrex Technology, Inc., Burnaby, BC (CA)

( * ) Notice: Subject to any disclaimer, the term of this patent is extended or adjusted under 35 U.S.C. 154(b) by 331 days.

(21) Appl. No.: 10/711,060

(22) Filed: Aug. 19, 2004

(65) Prior Publication Data

US 2006/0039127 A1   Feb. 23, 2006

(51) Int. Cl.
*H05K 1/11*   (2006.01)
(52) U.S. Cl. .................. 361/801; 361/759; 361/802; 361/756
(58) Field of Classification Search ................ 361/801, 361/802, 759, 756, 752–753
See application file for complete search history.

(56) References Cited

U.S. PATENT DOCUMENTS 5,497,291 A * 3/1996 Hosen ......................... 361/804
6,359,331 B1 * 3/2002 Rinehart et al. ............. 257/691
6,459,605 B1 * 10/2002 Reichard ..................... 363/147
6,661,659 B2 * 12/2003 Tamba et al. ............... 361/699
6,784,538 B2 * 8/2004 Nakamura et al. .......... 257/707
6,845,017 B2 * 1/2005 Ahmed et al. .............. 361/775
7,046,535 B2 * 5/2006 Rodriguez et al. .......... 363/146

* cited by examiner

*Primary Examiner*—Dean A. Reichard
*Assistant Examiner*—Abiy Getachew
(74) *Attorney, Agent, or Firm*—Thelen Reid Brown Raysman & Steiner LLP

(57) ABSTRACT

An electrical power circuit assembly including an insulated metal substrate (IMS) printed circuit board (PCB), a filter (PCB), and one or more bus bars disposed between the IMS PCB and the filter (PCB), the bus bar geometry configured to reduce the inductance between semiconductor power devices on the IMS PCB and capacitors on the filter PCB. For one embodiment, low profile bus bars are used between the IMS PCB and a fiberglass PCB. The fiberglass PCB has a plurality of filter capacitors electrically connected across the bus structure. The geometry and layout of the bus bars provides a connection from the IMS PCB to the fiberglass PCB with very low parasitic inductance between surface mounted semiconductor power devices on the IMS PCB and filter capacitors on the fiberglass PCB.

11 Claims, 7 Drawing Sheets

HIGH POWER DENSITY INSULATED METAL SUBSTRATE BASED POWER CONVERTER ASSEMBLY WITH VERY LOW BUS IMPEDANCE

FIG. 1 shows a section view of the invention preferred embodiment. The narrative description of the electromechanical assembly shown in FIG. 1 will first be given in a format paralleling the assembly process.

A plurality of machine screw studs 2 are screwed into heatsink 1. Thermally conductive pad 3, having clearance holes for studs 2 is placed over studs 2 to facilitate better heat transfer from the Insulated Metal Substrate (IMS) Printed Circuit Board (PCB) assembly 10 to heatsink 1. IMS PCB 10 comprises; metal substrate 14, electrical insulating layer 15 and top copper foil circuits 11, 12 and 13. Surface mount semiconductor power devices 16 and 17 are soldered to top copper foil circuits 11, 12 and 13. Spacers 24 consist of an electrically insulating material and are placed over studs 2 to register IMS board assembly 10 on heatsink 1. The clearance hole diameters on IMS PCB 10 are larger diameter than the outside diameter of spacers 24. Bus bars 21, 22 and 23 are placed over spacers 24 and rest on IMS PCB 10. PCB assembly 30 is a typical four layer PCB made with fiberglass insulating materials. PCB assembly 30 has clearance holes for all stud 2 locations and is placed over studs 2. Clamp bars 41 are placed over studs 2, one clamp bar 41 for each bus bar 21, 22 and 23. Machine nut 43 and lock washer 42 are used to clamp this entire stack-up together. Clamp bars 41 and heatsink 1 are rigid enough to substantially spread uniform clamping pressure over a large area thereby facilitating efficient heat transfer, low electrical contact resistance and mechanical structural integrity.

The invention comprises three electrical power circuits; −BUS, +BUS and AC BUS. Bottom foil circuit 31 connects through a plurality of circuit board vias 38A to inner layer 35 of PCB 30. This circuit is designated −BUS. With sufficient clamping pressure, bus bar 21 and IMS top foil 11 also become electrically common with −BUS. Bottom foil circuit 33 connects through a plurality of circuit board vias 38B to inner layer 36 of PCB 30. This circuit is designated +BUS. With sufficient clamping pressure, bus bar 23 and IMS top foil 13 become electrically common with +BUS. All capacitors 39 on PCB 30 are electrically connected across the +BUS and −BUS. The buried PCB 30 layers 35 and 36 are copper planes separated and/or covered by electrically insulating layers 34. The thicknesses of all PCB layers in FIG. 1 are exaggerated for clarity. Semiconductor switch 16 is any number of paralleled Field Effect Transistor (FET) devices with source connections to copper foil layer 11 and therefore −BUS. Semiconductor switch 17 is any number of paralleled FET devices with drain connections to copper foil layer 13. The drains of switch 16, the sources of switch 17 and IMS top foil 12 are common, designated as AC BUS and with sufficient clamping pressure are also electrically common to bus bar 22 and PCB 30 bottom foil 32.

Circuits and components electrically connected to chassis and earth ground are; heatsink 1, studs 2, top PCB circuit foil 37, clamp bars 41, lock washer 42 and machine nut 43. Although IMS substrate 14 is not grounded in the preferred embodiment; grounding of IMS substrate 14 is not precluded or functionally prohibited with the invention. PCB foils 37, heatsink 1 and to a large extent IMS substrate 14 act as shields and/or decoupling capacitors for Electro Magnetic Interference (EMI) suppression.

FIG. 2 shows the top view of IMS printed circuit board 10 referenced in FIG. 1. All reference designators are consistent with the designators in FIG. 1. Terminal 81 typically connects −BUS to the negative pole of an external DC supply. Terminal 82 typically connects AC BUS to external filter components and loads. Terminal 83 typically connects +BUS to the positive pole of an external DC supply. The dashed line labeled 30 shows the footprint of PCB 30 as in a completed assembly.

FIG. 3 shows the top view of filter printed circuit board 30 referenced in FIG. 1. All reference designators are consistent with the designators in FIG. 1

FIG. 4 shows the electrical schematic for the preferred embodiment of the invention illustrated from an electromechanical perspective in FIG. 1. FET 16 is a composite device comprising a plurality of FET devices connected with drain and source leads directly paralleled and with gate leads paralleled through gate resistors 66. Composite FET 17 is configured in the same way but with gate resistors 67. FET 16 and FET 17 are configured in a typical, known, half-bridge power circuit topology. Inductors 51 represent the lumped parasitic inductance from the FET 16 and 17 drain or source junctions to bus bars 21, 22 and 23. The invention allows for very short distances from both drain and source leads to the bus bars to minimize parasitic inductances 51. In the preferred embodiment, high frequency currents flow in the power semiconductor half-bridge pairs, the individual elements making up the composite FET 16 and FET 17 switches, perpendicular to the long axes of bus bars 21, 22 and 23. Because of this geometry, the parasitic inductance contributed by the bus bars is very nearly negligible. Inductors 52 represent the parasitic inductance in the path from bus bars 21 and 23 to capacitors 39. Parasitic inductances 52 are a result of the current from bus bars 21 and 23 being steered thru printed circuit board vias (FIG. 1, items 38A and 38B) on the filter capacitor PCB (FIG. 1, item 30) from bottom foils (FIG. 1, items 31 and 33) to the inner DC bus layers (FIG. 1, items 35 and 36 respectively). A large number of circuit board vias (FIG. 1, items 38A and 38B) run in a line that is parallel to the long axes of bus bars 21 and 23 to achieve very low values of parasitic inductance for these portions of the current paths. Inductor 53 is the characteristic inductance of each capacitor 39. The total equivalent parasitic inductance 53 is reduced in the preferred embodiment by first using capacitor components with low equivalent series resistances (ESR) and then paralleling a large number of these capacitors to reduce the overall inductance of the DC bus and to distribute the ESR over the planer bus area. Gate drive input 77 is electrically referenced to AC BUS and the source terminals of FET (s) 17. Gate drive input 76 is electrically referenced to −BUS and the source terminals of FET(s) 16. Gate driver circuits to drive gate driver inputs 77 and 76 as well as other ancillary circuits would normally, but not necessarily, be included on the IMS PCB. The gate driver circuits have been omitted here for clarity. Methods of driving FET devices are known as well as regulation and control methods for the half-bridge topology illustrated as the preferred embodiment.

FIG. 5 shows a simplified schematic of the half-bridge circuit topology used for the preferred embodiment illustrated in FIGS. 1 and 4. For clarity, semiconductor switching devices are illustrated as simple switches with anti-parallel diodes. All of the topology examples illustrated are multiples with minor variants of the half-bridge circuit topology described in the preceding text.

FIG. 6 shows a simplified schematic for a half-bridge circuit topology that incorporates a bipolar DC bus. One typical application for the electrical power circuit assembly, disclosed under this patent, using this topology would be a DC to AC converter where external DC power source 90 is connected from +DC to DC COM, external DCpower source 92 is connected from DC COM to −DC, external filter inductor 93 is connected to AC1 and where external load 94 is connected between the remaining side of the filter inductor 93 and ground 91. DC COM is also connected to ground 91. When this bipolar DC bus is used, one side of the load is typically connected with the DC COM terminal. Also, the DC COM terminal is typically connected to earth ground in 60 Hz AC power applications. The power topology illustrated in FIG. 6 is known and used here only to illustrate one of many applications for the invention.

FIG. 7 shows a simplified schematic for a full-bridge circuit topology intended for use with a mono-polar DC source. One typical application for this topology would be a DC to AC power converter that converts power from a 12V battery, connected across terminals +DC and −DC, to 120 Vac, 60 Hz where terminals AC1 and AC2 would be connected to a 60 Hz step-up transformer.

FIG. 8 shows a simplified schematic for a full-bridge circuit topology intended for use with a bipolar DC source. One typical application for this topology would be a DC to AC power converter that directly converts power from a +/−200 Vdc source connected to terminals +DC and −DC, respectively, both with respect to DC COM, to split-phase 120 Vac/240 Vac, 60 Hz where filter inductors would be connected between terminals AC1 and AC2 to AC loads.

Figure 1:
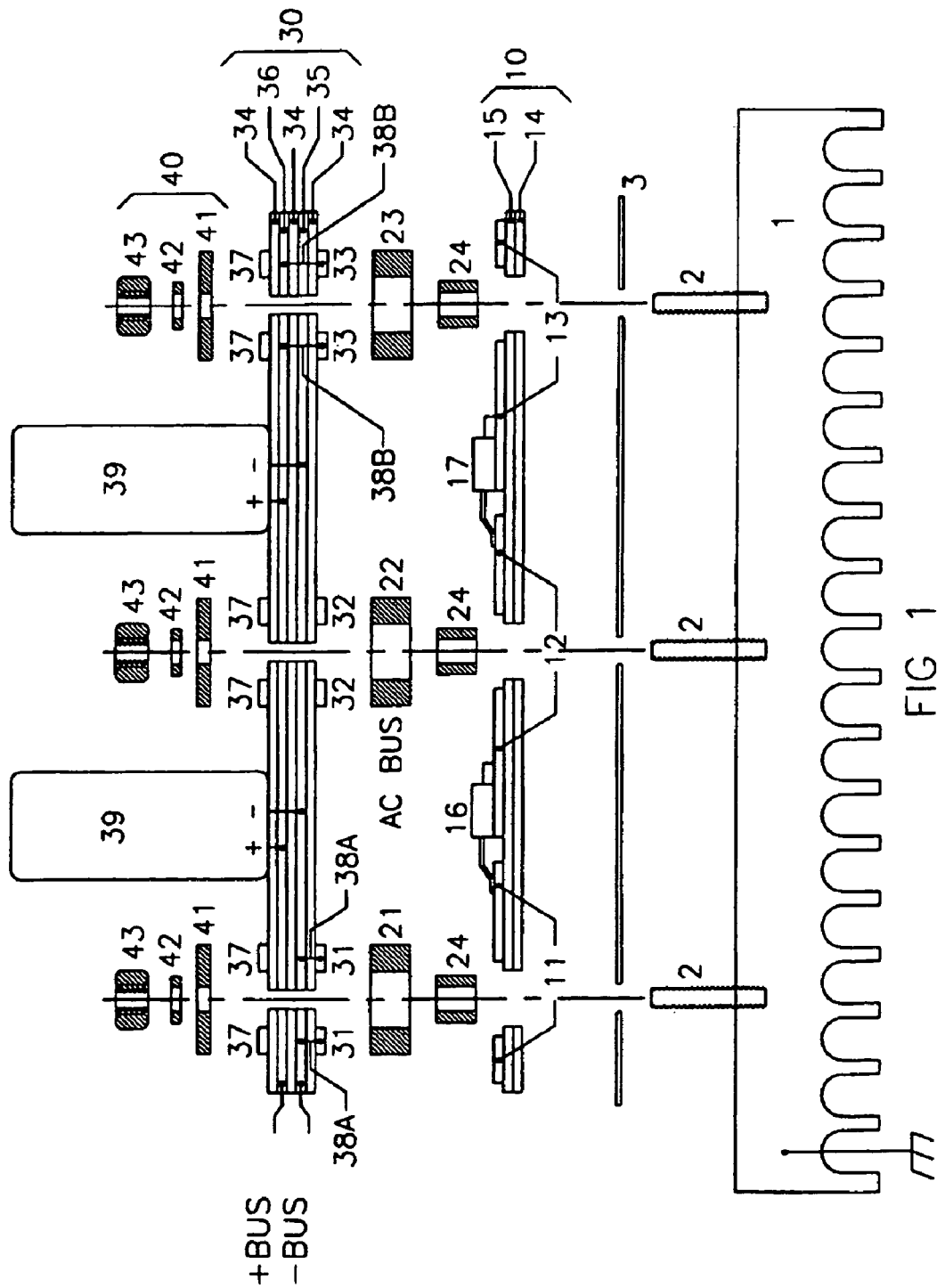

It is to be noted, however, that the embodiments of the invention are not limited to the described examples but can be freely varied within the scope of the claims.

BACKGROUND ART

This invention pertains to power electronics design and manufacture.

IMS circuit board materials are comprised of a metal substrate, usually aluminum or copper with a typical thickness from 0.040" to 0.125". A thin insulating material is bonded to the substrate and a layer of copper foil is bonded to the insulating material.

The IMS material is processed into printed circuit boards in much the same way as a typical fiberglass PCB where a photo mask is applied to the copper foil and the unwanted copper is chemically etched away, leaving the desired traces and pads.

For high power applications, IMS printed circuit boards have only one usable layer and are only suitable for surface mount components. Fiberglass boards can have many layers and a mix of through-hole and surface mount components. When power semiconductor devices are soldered onto an IMS printed circuit board, very low thermal resistances from the power components to the metal substrate are had. In high power applications, the metal substrate is in turn mounted to a heatsink. Low thermal resistance enables higher power to be processed with less silicon die area, which translates to lower costs and higher volumetric power density. The soldered connection of power devices to the heat transfer surface is much more reliable than any mechanical clamping method. Also, robotic pick-and-place assembly methods can be used on IMS PCB's assemblies having large numbers of surface mount power devices.

There are, however, two problems with the IMS materials for high power applications. First, the mechanical strength of the bond between the copper and insulating material and insulating material and substrate is limited. This weakness precludes the use of physically large, soldered, surface mounted terminals to hold large cables. A typical prior art method uses multiple, low-current, surface mount connectors, pins or headers to make the transition to a fiberglass PCB where a single, high current, high mechanical strength termination can be made. Second, the metal substrate layer is typically used only for mechanical support and heat transfer. It is desirable in most switch mode power converter applications to have a low AC impedance DC bus which requires a two layer circuit board or other laminated bus assembly. The IMS material is limited by effectively having only one layer and moreover cannot except the larger through-hole electrolytic capacitors typically required to achieve a low AC impedance DC bus.

Another prior art method disclosed under U.S. Pat. No. 5,715,141 by Karlsson describes a method of using conductive metal tubes between an IMS PCB and a fiberglass PCB. Machine screws are inserted through clearance holes in a top fiberglass PCB, through the center of the metal tubes, through clearance holes in a bottom IMS PCB and are threaded into a heatsink. The method provides local clamping pressure, at the screw and tube locations, between the IMS PCB and the heatsink. The tubes also provide current paths between the fiberglass PCB and the IMS PCB and act as spacers between the two PCBs.

The invention disclosed by Karlsson is limited to conductive spacing and clamping elements having a specific tubular geometry. It is not clear from Karlsson's patent that the method of conducting current from one PCB to another PCB using a tubular spacer or standoff is claimed as novel, a method that was obvious and known prior to the Karlsson patent.

The new invention uses a novel geometry and assembly for conductive spacing and clamping elements which allow the clamping pressure between an IMS PCB and a heatsink to be distributed over a much greater surface area compared to the prior art. The new invention also enables very low current densities to be achieved at board-to-board connections and in board-to-board connectors compared to the prior art. Both characteristics are a direct result of the bus bar geometry disclosed in the new patent and a novel method of easily facilitating the incorporation of these bus bars.

Other prior art methods, including the Karlsson patent, do not provide a method of collecting or summing the currents in multiple conductors (tubes in the Karlsson case) into a higher current conductor. The prior art does not include a method of making high current connections to external power sources and loads to/from IMS substrates. Most importantly, prior art methods do not enable low AC impedance connections to be made from the semiconductor switching devices on the IMS PCB to filter capacitors or other components on a second PCB, a key requirement in high frequency power converters.

What is new and novel is an arrangement of a heatsink, an IMS printed circuit board with power semiconductors, bus bars of a specific geometry, a fiberglass printed circuit board with capacitors and a mechanical clamping method which together allow surface mount power semiconductor switching devices to optimize the superlative heat transfer properties of IMS materials and operate from a very low AC impedance DC bus, characteristics that were mutually exclusive in the prior art.

With this invention, the bus bars perform multiple functions by spreading the clamp force to provide low resistance electrical contacts with the PCBs, distributing the clamp force between the IMS board and the heatsink for enhanced heat transfer, acting as a spacer between PCBs, providing a means to interface external sources and loads with the IMS PCB, presenting low DC impedances to currents in the bus bars and providing a low AC impedance interface to circuit boards mounted to the bus bars.

What is old and known are the power circuit topologies used on the IMS printed circuit board and the control methods commonly used with these circuit topologies to perform power conversion.

What is old and known is how to form a low AC impedance DC bus on a fiberglass printed circuit board by using different layers as power planes for various DC bus poles.

What is old and known is the composition and characteristics of Insulated Metal Substrates (IMS) materials.

FIG. 1 shows a section view of the invention preferred embodiment.

Figure 2:
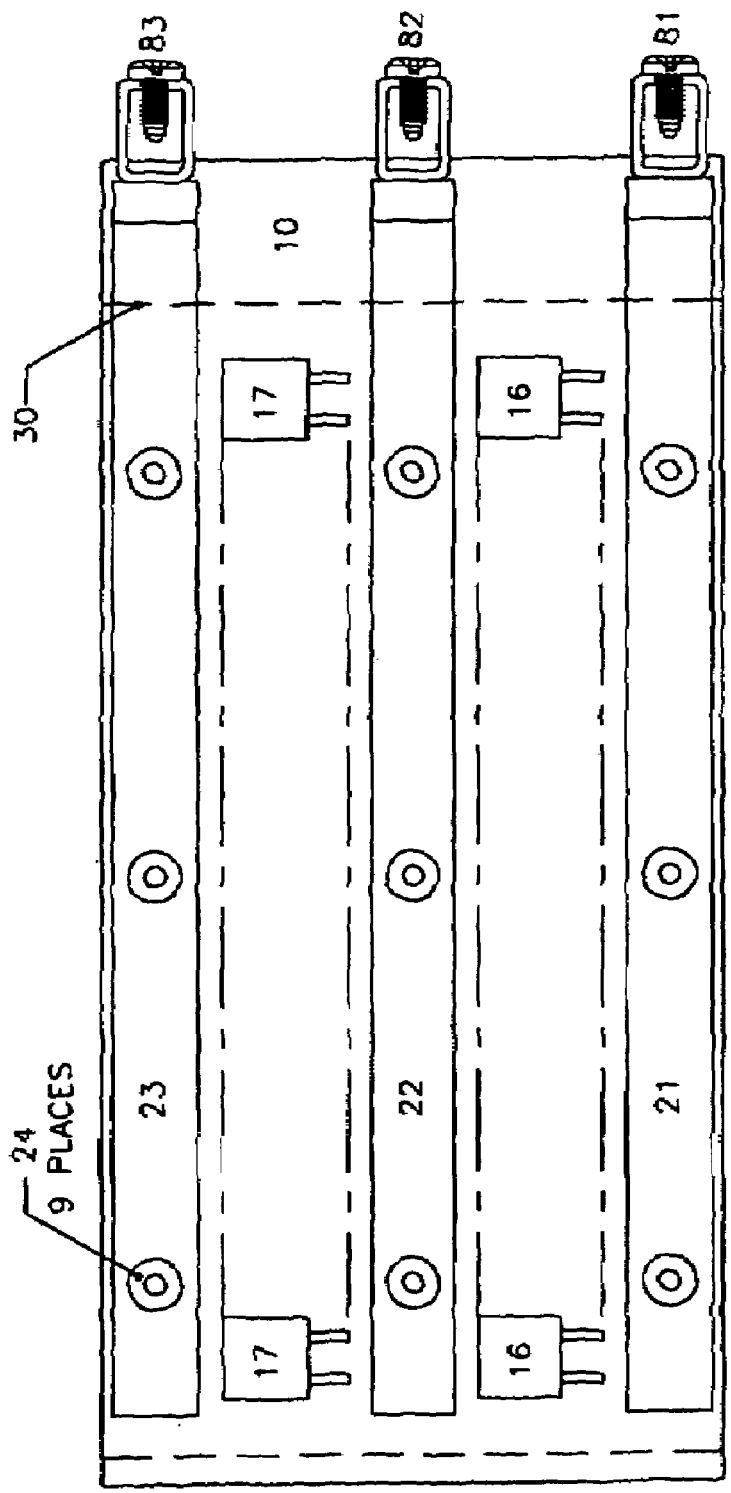

FIG. 2 shows the top view of the IMS printed circuit board referenced in FIG. 1.

Figure 3:
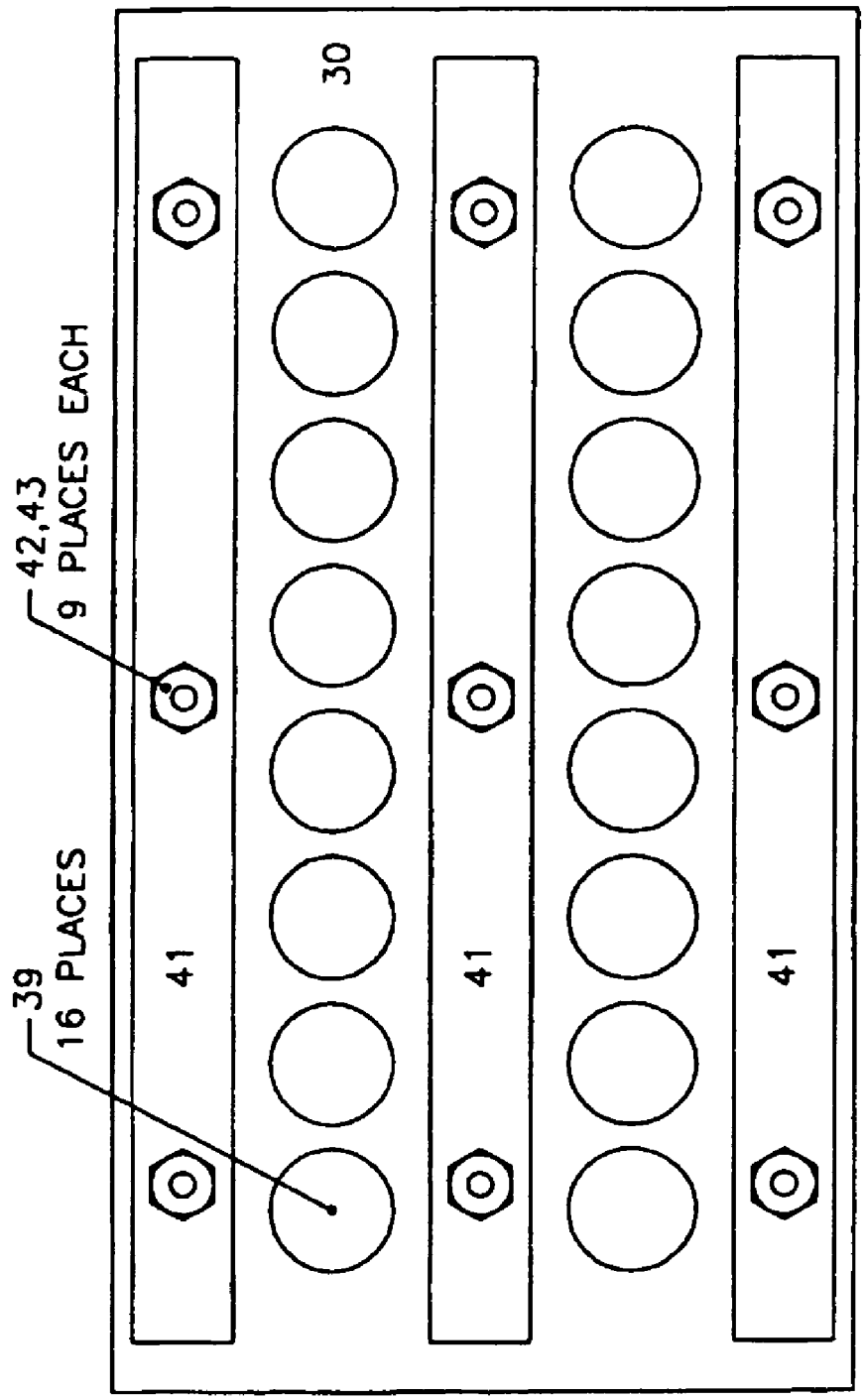

FIG. 3 shows the top view of the fiberglass printed circuit board referenced in FIG. 1.

Figure 4:
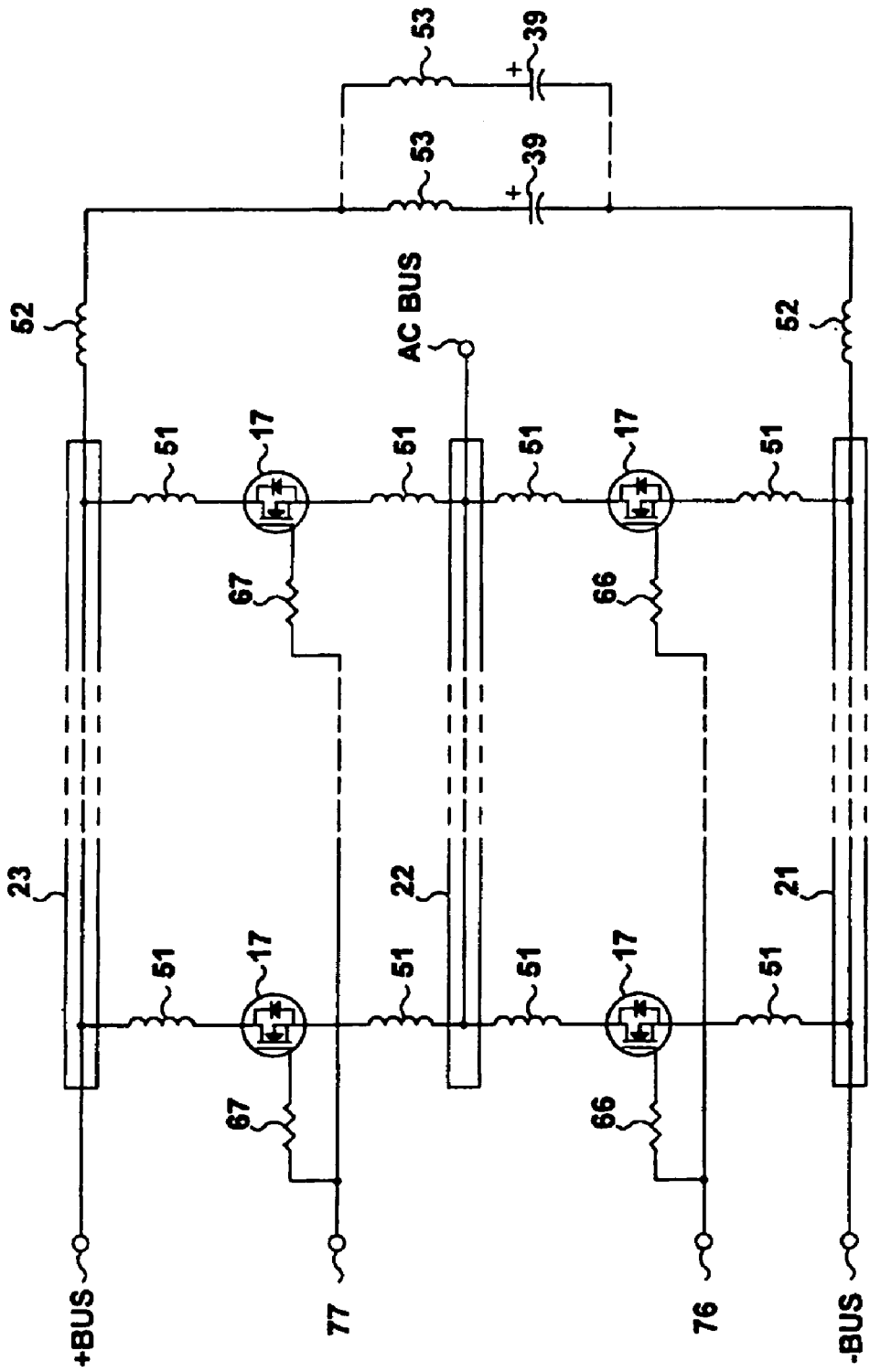

FIG. 4 shows the electrical schematic for the preferred embodiment of the invention illustrated from an electromechanical perspective in FIG. 1.

Figure 5:
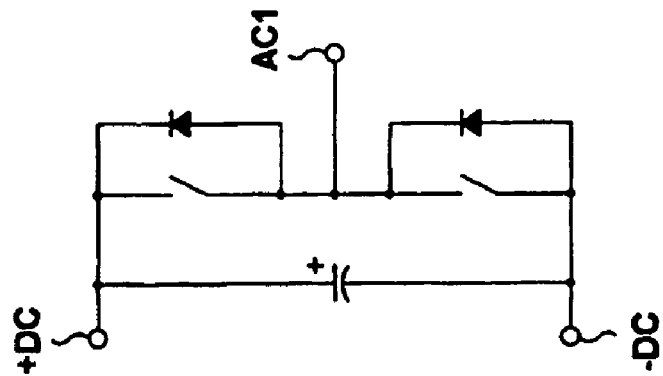

FIG. 5 shows a simplified schematic of the half-bridge circuit topology used for the preferred embodiment illustrated in FIGS. 1 and 4.

Figure 6:
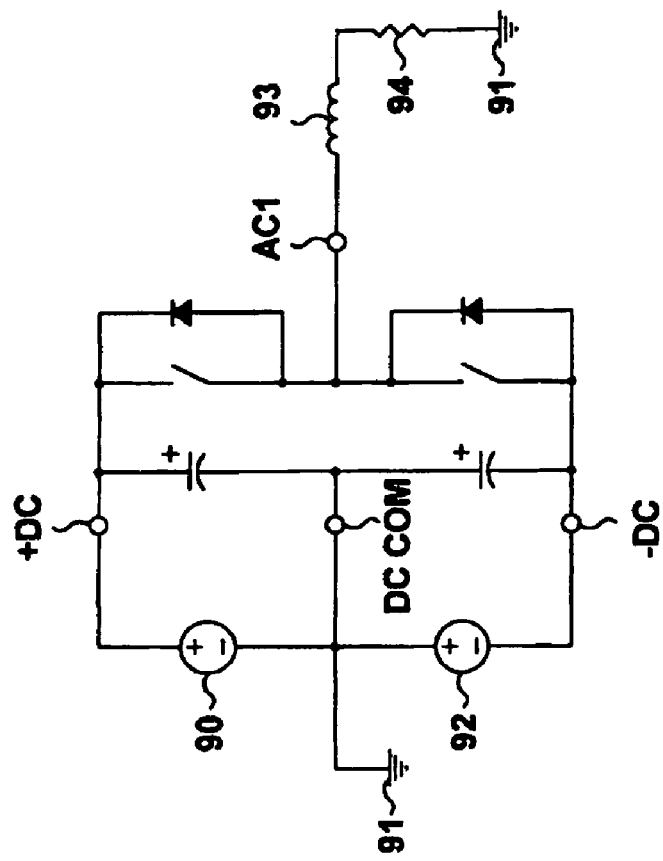

FIG. 6 shows a simplified schematic for a half-bridge circuit topology that incorporates a bipolar DC bus.

Figure 7:
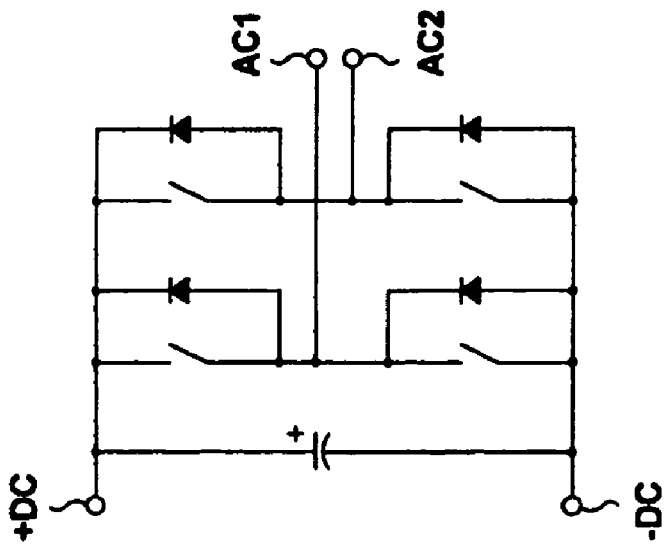

FIG. 7 shows a simplified schematic for a full-bridge circuit topology intended for use with a mono-polar DC source.

Figure 8:
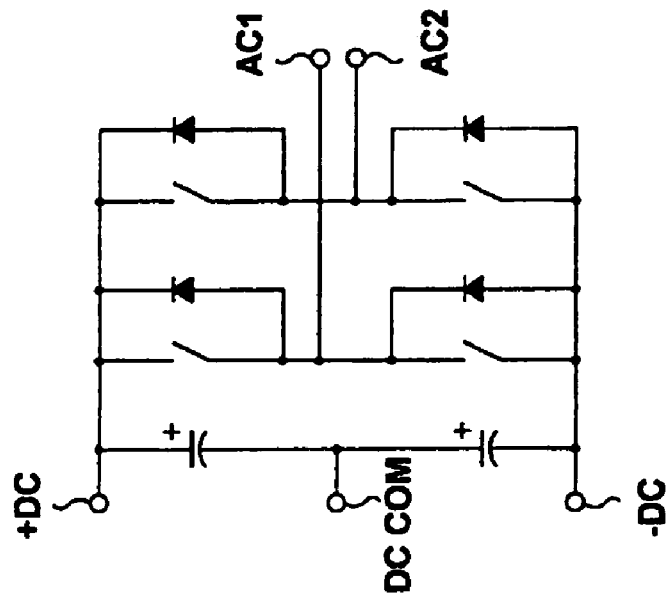

FIG. 8 shows a simplified schematic for a full-bridge circuit topology intended for use with a bipolar DC source.

Figure 9:
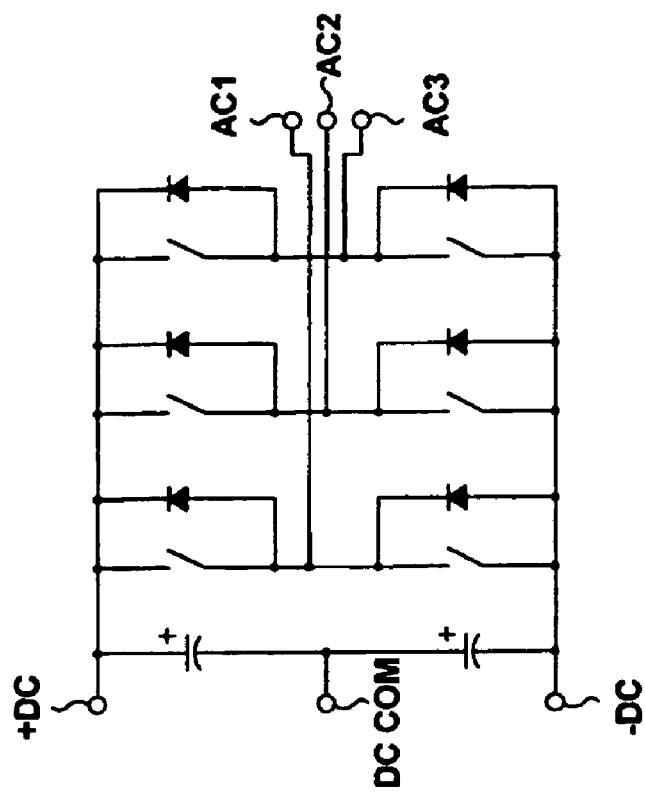
FIG. 9 shows a simplified schematic for a three-phase bridge circuit topology intended for use with a mono-polar DC source. One typical application for this topology would be a DC to AC motor drive that converts power from a battery, connected across terminals +DC and −DC, to drive traction motor windings connected to terminals AC1, AC2 and AC3.

FIG. 9 shows a simplified schematic for a three-phase bridge circuit topology intended for use with a mono-polar DC source.

Figure 10:
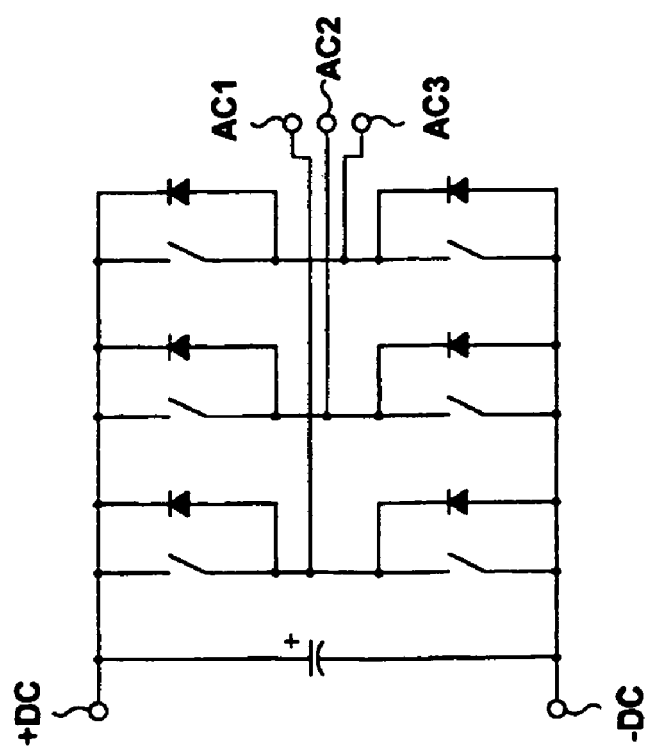
FIG. 10 shows a simplified schematic for a three-phase bridge circuit topology intended for use with a bipolar DC source. One application for this topology would be an inverter for converting DC power from bi-polar configured photovoltaic panels into a 3-phase, 4-wire, wye-configured utility grid distribution transformer.

FIG. 10 shows a simplified schematic for a three-phase bridge circuit topology intended for use with a bipolar DC source.

The invention claimed is:

1. An electrical power circuit assembly, apparatus and method comprising; an insulated metal substrate (IMS) printed circuit board (PCB) assembly, designated IMS PCB, further comprising a metal substrate, one or more electrically insulating layers, one or more electrically conductive circuit foil layers and a plurality of semiconductor power devices soldered to said conductive circuit foil layers, a second PCB assembly, designated filter PCB, further comprising, one or more electrically non-conductive board layers, one or more electrically conductive circuit foil layers and one or more capacitors, one or more, electrically conductive bus bars located between said IMS PCB and said filter PCB, where the bus bar minor dimension is between said PCBs and the major dimension runs perpendicular to the electrical current flow in said semiconductor power devices or where any other bus bar geometry is used that substantially serves to minimize the inductance between said semiconductor power devices on the IMS PCB and said capacitors on the filter PCB, a rigid heatsink or a heat removal surface, a clamping mechanism.

2. An electrical power circuit assembly according to claim 1 where the clamping pressure from said clamping mechanism creates electrical contact between at least one circuit foil, on said pcb circuit foil layers, and at least one bus bar.

3. An electrical power circuit assembly according to claim 1 further comprising hardware that clamps said filter PCB through said bus bars through said IMS PCB to said heatsink where the bus bar or bars are used to uniformly spread this clamping pressure through the IMS PCB to the heatsink at all locations substantially under the bus bar footprint or footprints.

4. An electrical power circuit assembly according to claim 1 where one or more said electrically conductive bus bar carries or bus bars carry current between the entire electrical power circuit assembly and external sources and/or loads.

5. An electrical power circuit assembly according to claim 1 where the conductive IMS substrate is used as an active current carrying component.

6. An electrical power circuit assembly according to claim 1 where some of said power semiconductor devices are soldered, fastened or clamped to the IMS metal substrate as opposed to all devices being soldered to the IMS conductive foil layers.

7. An electrical power circuit assembly according to claim 1 where some of said power semiconductor devices are soldered, fastened or clamped to the IMS conductive foil layers as opposed to all devices being soldered.

8. An electrical power circuit assembly according to claim 1 where the power semiconductor circuit arrangement on the IMS PCB is not limited to, but may be; a half-bridge, full-bridge, 3-phase bridge, all with either a mono-polar DC bus or a bipolar DC bus arrangement.

9. An electrical power circuit assembly according to claim 1 where the power semiconductor devices used on the IMS PCB may be, but are not limited to, field effect transistors, insulated gate bipolar transistors, rectifiers, bipolar transistors or any mix thereof.

10. An electrical power circuit assembly according to claim 1 where the filter PCB is a multi layer PCB or other laminated bus structure which uses buried layers as planes for the DC bus potentials.

11. An electrical power circuit assembly according to claim 1 where the capacitors on the filter PCB are either connected across a mono-polar DC bus circuit or two sets of capacitors are connected from two DC poles to a common DC bus potential in a bi-polar DC bus circuit arrangement.

* * * * *